United States Patent
Miyamura et al.

(10) Patent No.: US 11,881,535 B2
(45) Date of Patent: Jan. 23, 2024

(54) WOVEN FABRIC WITH PHOTOVOLTAIC UNIT

(71) Applicant: SUMINOE TEXTILE CO., LTD., Osaka (JP)

(72) Inventors: Yoshinari Miyamura, Nara (JP); Kazuyoshi Sugino, Nara (JP); Shunji Takeuchi, Nara (JP)

(73) Assignee: Suminoe Textile Co., Ltd., Osaka (JP)

( * ) Notice: Subject to any disclaimer, the term of this patent is extended or adjusted under 35 U.S.C. 154(b) by 0 days.

(21) Appl. No.: 17/415,223

(22) PCT Filed: Dec. 21, 2018

(86) PCT No.: PCT/JP2018/047276
§ 371 (c)(1),
(2) Date: Jun. 17, 2021

(87) PCT Pub. No.: WO2020/129240
PCT Pub. Date: Jun. 25, 2020

(65) Prior Publication Data
US 2022/0069148 A1 Mar. 3, 2022

(51) Int. Cl.
*H01L 31/0445* (2014.01)
*D03D 15/67* (2021.01)
(Continued)

(52) U.S. Cl.
CPC ....... *H01L 31/0445* (2014.12); *D03D 15/283* (2021.01); *D03D 15/533* (2021.01);
(Continued)

(58) Field of Classification Search
CPC ............ H01L 31/0445; H01L 31/0512; D03D 1/0076; D03D 15/533; D03D 15/547; D03D 15/67
See application file for complete search history.

(56) References Cited

U.S. PATENT DOCUMENTS 7,894,694 B2 * 2/2011 Gaudiana ............. H01G 9/2086
438/90
10,132,691 B2 11/2018 Kato et al.
(Continued)

FOREIGN PATENT DOCUMENTS

| JP | H0536999 A | 2/1993 |
|----|------------|--------|
| JP | 2007214599 A | 8/2007 |

(Continued)

OTHER PUBLICATIONS

JP 2009-200126 A English Translation as provided "Patent Translate: Powered by EPO and Google", translated on Apr. 7, 2022.*
(Continued)

*Primary Examiner* — Golam Mowla
(74) *Attorney, Agent, or Firm* — Millen, White, Zelano & Branigan, P.C.; William F. Nixon

(57) ABSTRACT

A woven fabric with a photovoltaic power generation portion performs photovoltaic power generation by light, such as, e.g., solar light, and has flexibility. The woven fabric is composed of warp yarns and weft yarns. The woven fabric includes at least one functional yarn with a photovoltaic power generation portion as a weft yarn. The functional yarn with a photovoltaic power generation portion includes a photovoltaic power generation portion, a positive electrode conductive wire material connected to a positive electrode of the photovoltaic power generation portion, and a negative electrode conductive wire material connected to a negative electrode of the photovoltaic power generation portion. At least two warp yarns are conductive yarns. One of the conductive yarn is in electric contact with the positive electrode conductive wire material. The other warp yarn is in electric contact with the negative electrode conductive wire material.

4 Claims, 3 Drawing Sheets

(51) Int. Cl.
- *D03D 15/283* (2021.01)
- *D03D 15/533* (2021.01)
- *D03D 15/547* (2021.01)
- *H01L 31/05* (2014.01)

(52) U.S. Cl.
CPC ........... *D03D 15/547* (2021.01); *D03D 15/67* (2021.01); *H01L 31/0512* (2013.01)

(56) References Cited

U.S. PATENT DOCUMENTS

| | | | | |
|---|---|---|---|---|
| 2003/0211797 | A1* | 11/2003 | Hill | H05K 1/038 442/205 |
| 2009/0139572 | A1* | 6/2009 | Gazda | H01L 31/0384 438/57 |
| 2009/0211620 | A1* | 8/2009 | Dibachi | H01L 31/0445 136/243 |
| 2015/0372249 | A1* | 12/2015 | Parent | D03D 15/46 136/256 |
| 2017/0059415 | A1 | 3/2017 | Kato et al. | |
| 2018/0371647 | A1* | 12/2018 | Sato | D02G 3/443 |

FOREIGN PATENT DOCUMENTS

| | | |
|---|---|---|
| JP | 2009200126 A | 9/2009 |
| JP | 2013007127 A | 1/2013 |
| JP | 2017017136 A | 1/2017 |
| JP | 2017047756 A | 3/2017 |
| WO | 2013076794 A1 | 5/2013 |

OTHER PUBLICATIONS

International Search Report for PCT/JP2018/047276 dated Feb. 26, 2019.
English Abstract of JP2009200126, Publication Date: Sep. 3, 2009.
English Abstract of JP2013007127, Publication Date: Jan. 10, 2013.
English Abstract of JP2017017136, Publication Date: Jan. 19, 2017.
English Abstract of JPH0536999, Publication Date: Feb. 12, 1993.
English Abstract of WO2013076794, Publication Date: May 30, 2013.
English Abstract of JP2007214599, Publication Date: Aug. 23, 2007.

* cited by examiner

WOVEN FABRIC WITH PHOTOVOLTAIC UNIT

TECHNICAL FIELD

The present invention relates to a woven fabric with a photovoltaic power generation portion capable of performing photovoltaic power generation by receiving light, such, as e.g., solar light.

BACKGROUND OF THE INVENTION

A functional fabric in which a functional portion is provided to a fabric, such as, e.g., a woven fabric, is known. For example, a sheet is known in which a sensor portion is provided to more accurately detect the information about a surface of a passenger car sheet (see Patent Document 1).

Further, a string-shaped flexible solar battery is known. In the solar battery, a plurality of solar cells is arranged in a row at predetermined intervals between adjacent solar cells. The plurality of solar cells is arranged in a state in which the conduction direction connecting the positive electrode and the negative electrodes of each pair of the plurality of solar cells is arranged in a direction orthogonal to the row direction. The plurality of positive electrodes and the plurality of negative electrodes of the plurality of solar cells are arranged in one row in each row direction. A pair of flexible bare-metal conductive wires for connecting a plurality of solar cells in parallel is provided. A flexible synthetic resin transparent covering material covering all of the solar cells and the pair of conductive wire materials in an embedded manner is provided (See Patent Document 2).

PRIOR ART DOCUMENT

Patent Document

Patent Document 1: Japanese Unexamined Patent Application Publication No. 2017-47756
Patent Document 2: Japanese Unexamined Patent Application Publication No. 2007-214599

SUMMARY OF THE INVENTION

Problems to be Solved by the Invention

However, in the woven fabric made by weaving by using a functional yarn with a semiconductor function element (string-shaped solar battery) described in Patent Document 2 as a part of the yarn, power can be generated by light reception. However, it is inferior in flexibility and stretchability as a fabric. In particular, since the functional yarn with a semiconductor function element is coated with a synthetic resin, the functional yarn becomes highly rigid. Therefore, the flexibility and stretchability of the fabric are lowered.

The present invention has been made in view of the above-mentioned technical background. An object of the present invention is to provide a flexible woven fabric with a photovoltaic power generation portion capable of performing photovoltaic power generation by light, such as, e.g., solar light.

Means for Solving the Problem

In order to achieve the above-described objects, the present invention provides the following means.

[1] A woven fabric with a photovoltaic power generation portion, comprising:
a warp yarn; and
a weft yarn,
wherein at least one weft yarn is configured by a functional yarn with a photovoltaic power generation portion,
wherein the functional yarn with a photovoltaic power generation portion includes a photovoltaic power generation portion, a positive electrode conductive wire material connected a positive electrode of the photovoltaic power generation portion, and a negative electrode conductive wire material connected to a negative electrode of the photovoltaic power generation portion, and
wherein at least two warp yarns are conductive yearns, one of the conductive yarns as a warp yarn is in electric contact with the positive electrode conductive wire material, and the other of the conductive yarns as a warp yarn is in electric contact with the negative electrode conductive wire material.

[2] The woven fabric with a photovoltaic power generation portion as recited in the above-described Item [1],
where two conductive yarns as warp yarns are in electric contact with the positive electrode conductive wire material and arranged in parallel to each other, and
wherein two conductive yarns as warp yarns are in electric contact with the negative electrode conductive wire material and arranged in parallel to each other.

[3] The woven fabric with a photovoltaic power generation portion as recited in the above-described Item [1],
wherein two conductive yarns as warp yarns in electric contact with the positive electrode conductive wire material are arranged side by side in parallel to each other, and
wherein two conductive yarns as warp yarns in electric contact with the negative electrode conductive wire material are arranged side by side in parallel to each other.

[4] The woven fabric with a photovoltaic power generation portion as recited in any one of the above-described Items [1] to [3],
wherein the conductive wire material as a warp yarn in electric contact with the positive conductive yarn is in electric contact with one of an upper side and a lower side of the positive electrode conductive wire material and woven on the other of an upper side and a lower side of upper and lower weft yarns arranged adjacent to the positive electrode conductive yarn in such a manner as to be in contact with the other of the upper side and the lower side of both the adjacent weft yarns, and
wherein the conductive wire material as a warp yarn in electric contact with the negative conductive yarn is in electric contact with one of an upper side and a lower side of the negative electrode conductive wire material and woven on the other of an upper side and a lower side of weft yarns arranged adjacent to the negative electrode conductive yarn in such a manner as to be in contact with the other of the upper side and the lower side of both the adjacent weft yarns.

[5] A woven fabric with a photovoltaic power generation portion, comprising:
a warp yarn; and
a weft yarn, wherein at least two weft yarns each are configured by a functional yarn with a photovoltaic power generation portion, wherein the functional yarn with a photovoltaic power generation portion includes a photovoltaic power generation portion, a positive electrode conductive wire material connected to a positive electrode of the photovoltaic power generation portion, and a negative electrode conductive wire material connected to a negative electrode of the photovoltaic power generation portion, wherein a first functional yarn with a photovoltaic power generation portion and a second functional yarn with a photovoltaic power generation portion as weft yarns are arranged away from each other in a warp direction, and the two functional yarns each provided with a photovoltaic power generation portion are arranged such that a positive electrode conductive wire material of one of the functional yarns and a negative electrode conductive wire material of the other of the functional yarns are arranged on the same side in the weft direction with respect to the photovoltaic power generation portion, wherein a first conductive yarn as a warp yarn is arranged, the first conductive yarn being in electric contact with the positive electrode conductive wire material of the first functional yarn with a photovoltaic power generation portion and in electric contact with the negative electrode conductive wire material of the second functional yarn with a photovoltaic power generation portion, wherein a second conductive yarn as a warp yarn is arranged, the second conductive yarn being in electric contact with the negative electrode conductive wire material of the first functional yarn with a photovoltaic power generation portion and in electric contact with the positive electrode conductive wire material of the second functional yarn with a photovoltaic power generation portion, and wherein one of the conductive yarns of the first conductive yarn and the second conductive yarn is electrically disconnected in an area corresponding to between the first functional yarn with a photovoltaic power generation portion and the second functional yarn with a photovoltaic power generation portion, and the photovoltaic power generation portion of the first functional yarn with a photovoltaic power generation portion and the photovoltaic power generation portion of the second functional yarn with a photovoltaic power generation portion are connected in series.

[6] A woven fabric with a photovoltaic power generation portion, comprising:
a warp yarn; and
a weft yarn,
wherein at least two weft yarns each are configured by a functional yarn with a photovoltaic power generation portion,
wherein the functional yarn with a photovoltaic power generation portion includes a photovoltaic power generation portion, a positive electrode conductive wire material connected to a positive electrode of the photovoltaic power generation portion, and a negative electrode conductive wire material connected to a negative electrode of the photovoltaic power generation portion, wherein a first functional yarn with a photovoltaic power generation portion and a second functional yarn with a photovoltaic power generation portion as weft yarns are arranged apart from each other in a warp direction, and the two functional yarns each provided with a photovoltaic power generation portion are arranged such that a positive electrode conductive wire material of one of the functional yarns and a negative electrode conductive wire material of the other of the functional yarns are arranged on the same side in a weft direction with respect to the photovoltaic power generation portion, wherein a first conductive yarn as a warp yarn is arranged, the first conductive yarn being in electric contact with the positive electrode conductive wire material of the first functional yarn with a photovoltaic power generation portion and in electric contact with the negative electrode conductive wire material of the second functional yarn with a photovoltaic power generation portion, wherein a second conductive yarn as a warp yarn is arranged, the second conductive yarn being in electric contact with the negative electrode conductive wire material of the first functional yarn with a photovoltaic power generation portion and not in electric contact with the positive electrode conductive wire material of the second functional yarn with a photovoltaic power generation portion, wherein a third conductive yarn as a warp yarn is arranged, the third conductive yarn being in electric contact with the positive electrode conductive wire material of the second functional yarn with a photovoltaic power generation portion and not in electric contact with the negative electrode conductive wire material of the first functional yarn with a photovoltaic power generation portion, and wherein the photovoltaic power generation portion of the first functional yarn with a photovoltaic power generation portion and the photovoltaic power generation portion of the second functional yarn with a photovoltaic power generation portion are connected in series.

[7] A woven fabric with a photovoltaic power generation portion, comprising:
a warp yarn; and
a weft yarn,
wherein at least two weft yarns are each configured by a functional yarn with a photovoltaic power generation portion,
wherein the functional yarn with a photovoltaic power generation portion includes a photovoltaic power generation portion, a positive electrode conductive wire material connected a positive electrode of the photovoltaic power generation portion, and a negative electrode conductive wire material connected to a negative electrode of the photovoltaic power generation portion, wherein a first functional yarn with a photovoltaic power generation portion and a second functional yarn with a photovoltaic power generation portion as weft yarns are arranged away from each other in a warp direction, and the two functional yarns each provided with a photovoltaic power generation portion are arranged such that a positive electrode conductive wire material of one of the functional yarns and a positive electrode conductive wire material of the other of the functional yarns are arranged on the same side with respect to the photovoltaic power generation portion,
wherein a first conductive yarn as a warp yarn is arranged, the first conductive yarn being in electric contact with the positive electrode conductive wire material of the first functional yarn with a photovoltaic power generation portion and in electric contact with the positive electrode conductive wire material of the second functional yarn with a photovoltaic power generation portion,
wherein a second conductive yarn as a warp yarn is arranged, the second conductive yarn being in electric contact with the negative electrode conductive wire material of the first functional yarn with a photovoltaic power generation portion and in electric contact with the negative electrode conductive wire material of the second functional yarn with a photovoltaic power generation portion, and
wherein the photovoltaic power generation portion of the first functional yarn with the first photovoltaic power generation portion and the photovoltaic power generation portion of the second functional yarn with the second photovoltaic power generation portion are connected in parallel.

[8] A woven fabric with a photovoltaic power generation portion, comprising:
a warp yarn; and
a weft yarn,
wherein at least one warp yarn is configured by a functional yarn with a photovoltaic power generation portion,
wherein the functional yarn with a photovoltaic power generation portion includes a photovoltaic power generation portion, a positive electrode conductive wire material connected a positive electrode of the photovoltaic power generation portion, and a negative electrode conductive wire material connected to a negative electrode of the photovoltaic power generation portion, and
wherein at least two weft yarns are each configured by a conductive yarn, one of the conductive yarns as a weft yarn is in electric contact with the positive electrode conductive wire material, and the other conductive yarn as a weft yarn is in electric contact with the negative electrode conductive wire material.

Effects of the Invention

In the invention recited in the above-described Item [1], it is possible to provide a flexible fabric with a photovoltaic power generation portion, the woven fabric having flexibility and being capable of performing photovoltaic power generation by light, such as, e.g., solar light.

The invention recited in the above-described Item [2], sufficient electrical connection between the positive electrode conductive wire material and the conductive yarn can be secured, and sufficient electrical connection between the negative electrode conductive wire material and the conductive yarn can be secured.

In the invention recited in the above-described Item [3], an adequate electrical connection between the positive electrode conductive wire material and the conductive yarn can be ensured, and an adequate electrical connection between the negative electrode conductive wire material and the conductive yarn can be ensured.

In the invention recited in the above-described Item [4], the electrical connection between the positive electrode conductive wire material and the conductive yarn can be secured stably and reliably, and the electrical connection between the negative electrode conductive wire material and the conductive yarn can be secured stably and reliably.

In the invention recited in the above-described Item [5], a woven fabric with a photovoltaic power generation portion can be provided in which at least two photovoltaic power generation portions are connected in series.

In the invention recited in the above-described Item [6], a woven fabric with a photovoltaic power generation portion can be provided in which at least two photovoltaic power generation portions are connected in series.

In the invention recited in the above-described Item [7], a woven fabric with a photovoltaic power generation portion can be provided in which at least two photovoltaic power generation portions are connected in parallel.

The invention recited in the above-described Item [8], a woven fabric with a photovoltaic power generation portion can be provided in which the woven fabric has flexibility and is capable of performing photovoltaic power generation by light, such as, e.g., solar light.

EMBODIMENTS FOR CARRYING OUT THE INVENTION

Figure 1:
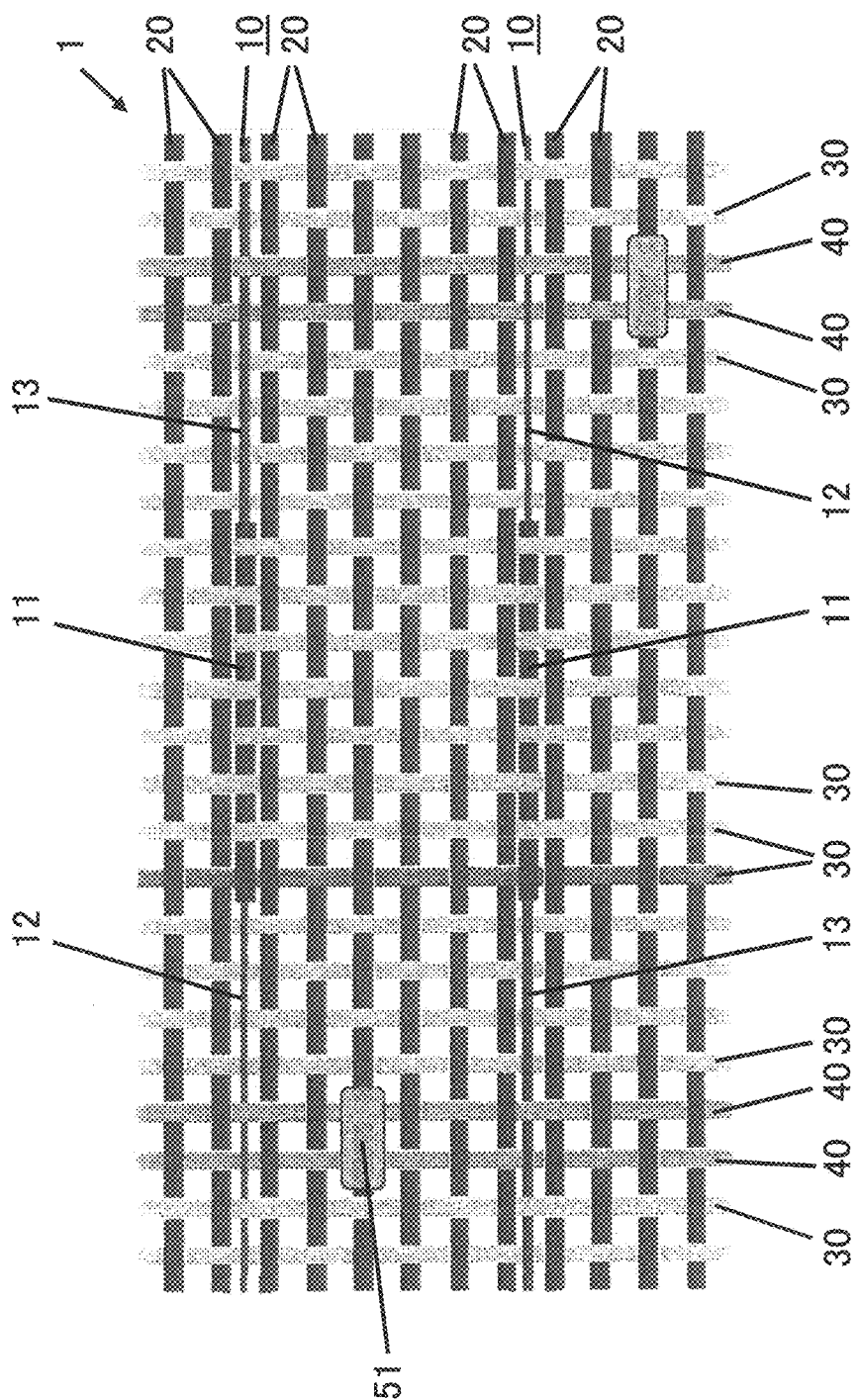
FIG. 1 is a plan view showing a first embodiment of a woven fabric with a photovoltaic power generation portion according to the present invention.

FIG. 1 shows a plan view of a first embodiment of a woven fabric with a photovoltaic power generation portion according to the present invention. The woven fabric 1 with a photovoltaic power generation portion is a woven fabric composed of a warp yarn (insulating yarn) 30 and a weft yarn (insulating yarn) 20. The warp yarn (insulating yarn) 30 and the weft yarn (insulating yarn) 20 are basically plainly oven. In this embodiment, two weft yarns are configured by functional yarns 10 each provided with a photovoltaic power generation portion. Six weft yarns (insulating yarn) 20 are arranged between these two functional yarns 10 each provided with a photovoltaic power generation portion (see FIG. 1). That is, the first functional yarn 10 with a photovoltaic power generation portion serving as a weft yarn and the second functional yarn 10 with a photovoltaic power generation portion serving as a weft yarn are arranged apart in the warp direction (spaced apart by six pieces of weft yarns). Note that, in FIG. 1, the weft yarn in which no reference numeral is allotted is a weft yarn (insulating yarn) 20, the warp yarn in which no reference numeral is allotted is a warp yarn (insulating yarn) 30, and the same applies to FIG. 2 which will be described later.

The functional yarn 10 with a photovoltaic power generation portion is configured by a photovoltaic power generation portion 11, a positive electrode conductive wire material 12 connected to a positive electrode of the photovoltaic power generation portion 11, and a negative electrode conductive wire material 13 connected to a negative electrode of the photovoltaic power generation portion 11 (see FIG. 1). In the above-described two functional yarns 10 and 10 each provided with a photovoltaic power generation portion, the positive electrode conductive wire material 12 of one of the functional yarns 10 and the negative electrode conductive wire material 13 of the other of the functional yarns 10 are arranged on the same side in the weft direction with respect to the photovoltaic power generation portion 11. For example, in FIG. 1, the positive electrode conductive wire material 12 of the functional yarn 10 with a photovoltaic power generation portion located on the upper side of the figure and the negative electrode conductive wire material 13 of the functional yarn 10 with a photovoltaic power generation portion located on the lower side of the figure are arranged on the left side with respect to the photovoltaic power generation portion 11 located in the center. Further, the negative electrode conductive wire material 13 of the functional yarn 10 with a photovoltaic power generation portion located on the upper side of the figure and the positive electrode conductive wire material 12 of the functional yarn 10 with a photovoltaic power generation portion located on the lower side of the figure are arranged on the right side with respect to the photovoltaic power generation portion 11 in the center (see FIG. 1). The photovoltaic power generation portion 11 is a member capable of generating electricity when the light-receiving surface thereof is irradiated with light, such as, e.g., solar light. As the photovoltaic power generation portion 11, for example, an organic thin-film solar battery, a perovskite solar battery, a dye-sensitized solar battery, an amorphous silicon solar battery, a CIS solar battery, or a CIGS solar battery may be used, but not limited thereto. The CIS solar battery is a solar battery using copper (Cu), indium (In), and selenium (Se), as raw materials. The CIGS solar battery is a solar battery using copper (Cu), indium (In), selenium (Se), and gallium (Ga), as raw materials.

Thus, a pair of first conductive yarns as warp yarns (two conductive yarns on the left side in FIG. 1) 40 is in electrical contact with the positive electrode conductive wire material 12 of the first functional yarn 10 with a photovoltaic power generation portion on the upper side of the figure. Further, the pair of first conductive yarns is in electrical contact with the negative electrode conductive wire material 13 of the second functional yarn 10 with a photovoltaic power generation portion on the lower side of the figure (see FIG. 1). The pair of first conductive yarns (two conductive yarns on the left in FIG. 1) 40 is plainly woven to the other weft yarns (insulating yarns) 20.

Further, a pair of second conductive yarns 40 as warp yarns (two conductive yarns on the right side in FIG. 1) 40 is in electrical contact with the negative electrode conductive wire material 13 of the first functional yarn 10 with a photovoltaic power generation portion on the upper side of the figure. Further, the pair of second conductive yarns 40 is in electrical contact with the positive electrode conductive wire material 12 of the second functional yarn 10 with a photovoltaic power generation portion on the lower side of the figure (see FIG. 1). The pair of second conductive yarn 40 (two conductive yarns on the right side in FIG. 1) is plainly woven to the other weft yarns (insulating yarns) 20.

Furthermore, the pair of the first conductive yarns (two conductive yarns on the left in FIG. 1) 40 is disconnected in the area corresponding to between the positive electrode conductive wire material 12 of the first functional yarn 10 with a photovoltaic power generation portion and the negative electrode conductive wire material 13 of the second functional yarn 10 with a photovoltaic power generation portion (see FIG. 1). In FIG. 1, the reference numeral "51" denotes the disconnected position of the first conductive yarn 40 (note that the weft yarn is not disconnected at the position 51). With such a disconnection structure, the two photovoltaic power generation portions 11 are connected in series via the pair of second conductive yarns (two conductive yarns on the right side in FIG. 1) 40. Since the woven fabric with a photovoltaic power generation portion of this embodiment is provided with two photovoltaic power generation portions 11 connected in series as described above, it is possible to generate electricity by light irradiation (solar light irradiation, etc.) to the photovoltaic power generation portions 11. Therefore, a curtain provided with a photovoltaic power generation function can be provided by configuring, for example, a curtain using the woven fabric 1 with a photovoltaic power generation portion of the present invention.

Figure 2:
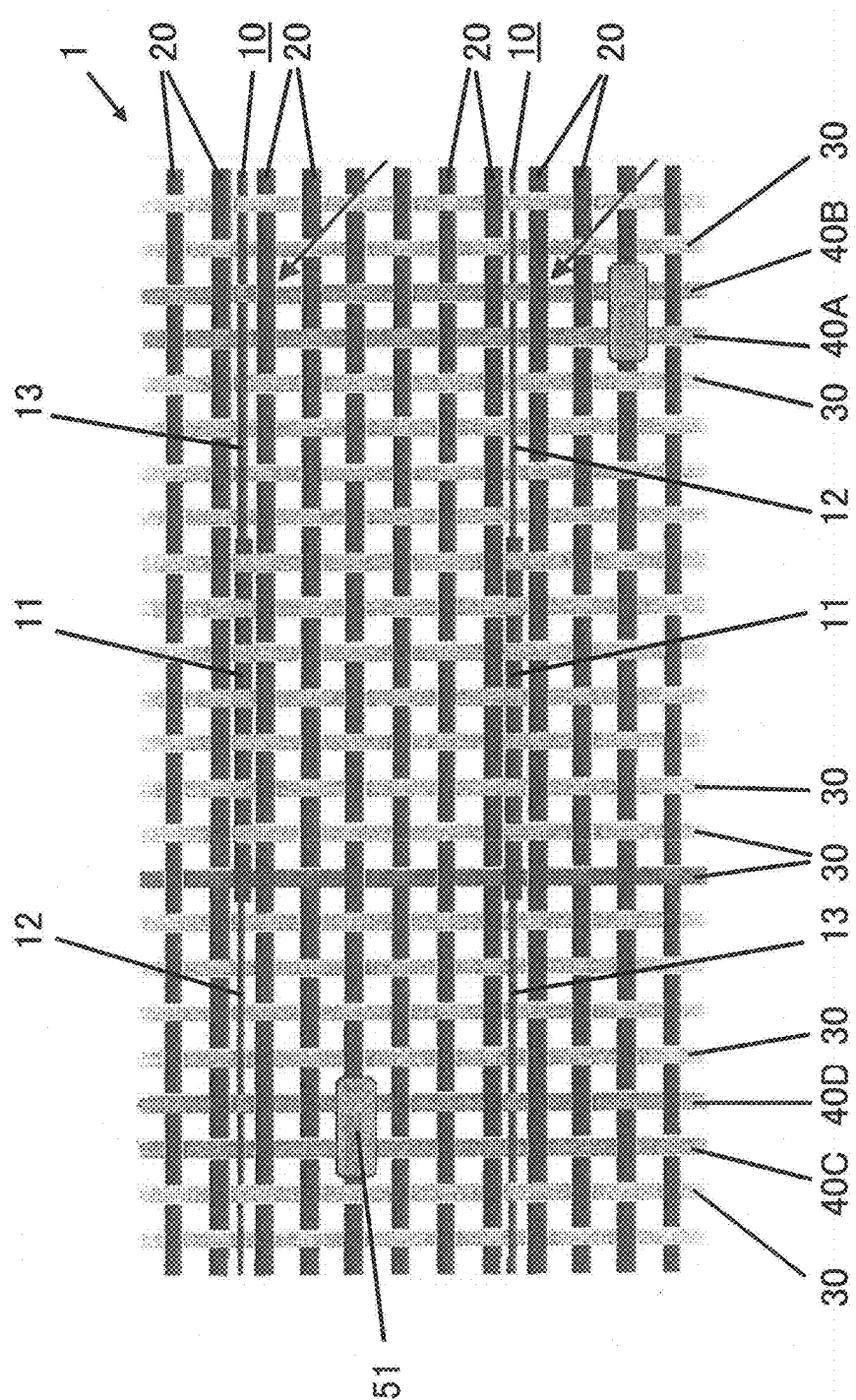
FIG. 2 is a plan view showing a second embodiment of a woven fabric with a photovoltaic power generation portion according to the present invention.

A plan view of a second embodiment of a woven fabric with a photovoltaic power generation portion according to the present invention is shown in FIG. 2. This woven fabric with a photovoltaic power generation portion has the same woven structure as in the first embodiment except for the following configuration. That is, the woven structure of the rightmost conductive yarn 40B between the two right conductive yarns 40A and 40B with respect to the negative electrode conductive wire material 13 and the positive electrode conductive wire material 12 is different from that in the first embodiment. Further, the woven structure of the rightmost conductive yarn 40D between the two left conductive yarns 40C and 40D with respect to the positive electrode conductive wire material 12 and the negative electrode conductive wire material 13 is different from that in the first embodiment.

That is, in this second embodiment, the rightmost conductive yarn 40B between the two right conductive yarns 40A and 40B is in electric contact with the upper side of the negative electrode conductive wire material 13 of the first functional yarn 10 with a photovoltaic power generation portion on the upper side of the figure. On the other hand, the rightmost conductive yarn 40B is woven into the lower side of both the weft yarns (insulating yarns) 20 and 20 adjacent to the negative electrode conductive wire material 13 and is in contact with the lower side of these two adjacent weft yarns (insulating yarns) 20 and 20 (see the arrow portions in FIG. 2). Similarly, the rightmost conductive yarn 40B of the two conductive yarns 40A and 40B on the right side in electric contact with the upper side of the positive electrode conductive wire material 12 of the second functional yarn 10 with a photovoltaic power generation portion on the lower side of the figure. On the other hand, the rightmost conductive yarn 40B is woven into the lower side of both the adjacent weft yarns (insulating yarns) 20 and 20 next to the positive electrode conductive wire material 12 and is in contact with the lower side of these two adjacent weft yarns (insulating yarns) 20 and 20 (see the arrow portion in FIG. 2). With such a woven structure, the electric conduction between the conductive yarn 40B and the negative electrode conductive wire material 13 and between the conductive yarn 40B and the positive electrode conductive wire material 12 can be sufficiently ensured.

Further, the rightmost conductive yarn 40D of the two conductive yarns 40C and 40D on the left side in the figure has the following woven structure. That is, the rightmost conductive yarn 40D is in electric contact with the upper side of the positive electrode conductive wire material 12 of the first functional yarn 10 with a photovoltaic power generation portion. The rightmost conductive yarn 40D is woven into the lower side of the adjacent weft yarns (insulating yarns) 20 and 20 next to the positive electrode conductive wire material 12 and is in contact with the lower side of these two adjacent weft yarns (insulating yarns) 20 and 20 (see FIG. 2). Similarly, the rightmost conductive yarn 40D of the two conductive yarns 40C and 40D on the left side in the figure has the following woven structure. That is, the rightmost conductive yarn 40D is in electric contact with the upper side of negative electrode conductive wire material 13 of the second functional yarn 10 with a photovoltaic power generation portion. On the other hand, the rightmost conductive yarn 40D is woven into the lower side of the adjacent weft yarns (insulating yarns) 20 and 20 next to the negative electrode conductive wire material 13 and is in contact with the lower side of these adjacent weft yarns (insulating yarns) 20 and 20 (see FIG. 2). With such a woven structure, it is possible to sufficiently ensure the electric conduction between the conductive yarn 40 and the positive electrode conductive wire material 12 and between the conductive yarn 40 and the negative electrode conductive wire material 13.

Figure 3:
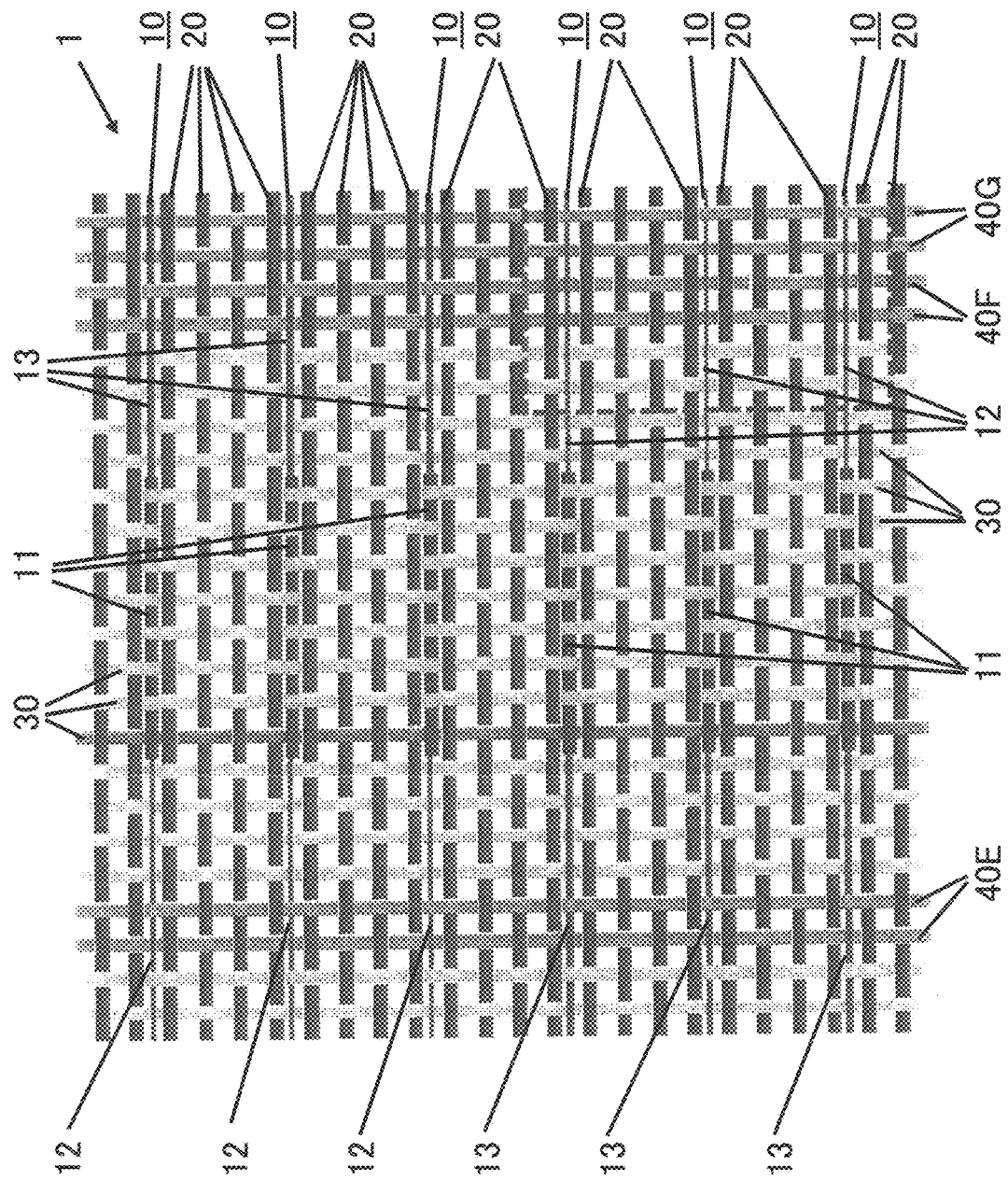
FIG. 3 is a plan view showing a third embodiment of a woven fabric with a photovoltaic power generation portion according to the present invention.

Next, a plan view of a third embodiment of a woven fabric with a photovoltaic power generation portion according to the present invention is shown in FIG. 3. This woven fabric 1 with a photovoltaic power generation portion is a woven fabric composed of warp yarns (insulating yarns) 30 and weft yarns (insulating yarns) 20. The warp yarn (insulating yarn) 30 and the weft yarn (insulating yarn) 20 are basically plainly woven. In this embodiment, each of six weft yarns is configured by a functional yarn 10 with a photovoltaic power generation portion. Between each of the six functional yarns 10 with a photovoltaic power generation portion, four weft yarns (insulating yarns) 20 are arranged (see FIG. 3). Note that in FIG. 3, weft yarns with no reference numerals are weft yarns (insulating yarns) 20. Also, note that warp yarns with no reference numerals are warp yarns (insulating yarns) 30.

The functional yarn 10 with a photovoltaic power generation portion is composed of a photovoltaic power generation portion 11, a positive electrode conductive wire material 12 connected to a positive electrode of the photovoltaic power generation portion 11, a negative electrode conductive wire material 13 connected to a negative electrode of the photovoltaic power generation portion 11 (see FIG. 3). In the three functional yarns 10 each provided with a photovoltaic power generation portion on the upper side of the figure, the positive electrode conductive wire material 12 is arranged on the left side with respect to the photovoltaic power generation portion 11. The negative electrode conductive wire material 13 is arranged on the right side with respect to the photovoltaic power generation portion 11 (see FIG. 3).

Further, in the three functional yarns 10 each provided with a photovoltaic power generation portion of the lower side of the figure, the positive electrode conductive wire material 12 is arranged on the right side with respect to the photovoltaic power generation portion 11. The negative electrode conductive wire material 13 is arranged on the left side with respect to the photovoltaic power generation portion 11 (see FIG. 3). In this way, in the three upper side functional yarns 10 each provided with a photovoltaic power generation portion and the three lower side functional yarns 10 each provided with a photovoltaic power generation portion, the arrangement positions of the positive electrode conductive wire materials 12 are reversed left and right (i.e., the arrangement positions of the negative electrode conductive wire materials 13 are also reversed left and right).

The pair of first conductive yarns 40E and 40E (two conductive yarns on the left side in FIG. 3) as warp yarns is in electrical contact with the positive electrode conductive wire materials 12 of the three functional yarns 10 each provided with a photovoltaic power generation portion on the upper side of the figure. While the pair of first conductive yarns 40E and 40E are in electrical contact with the negative electrode conductive wire materials 13 of the three functional yarns 10 each provided with a photovoltaic power generation portion on the lower side (see FIG. 3). Note that the pair of first conductive yarns (two conductive yarns on the left side in FIG. 3) 40E and 40E is plainly woven with respect to the other weft yarns (insulating yarns) 20.

Further, four conductive yarn (four conductive yarns on the right side in FIG. 1 3) 40F, 40F, 40G, and 40G as warp yarns are arranged on the right side of the photovoltaic power generation portion 11. The two second conductive yarns 40F and 40F on the left of the four conductive yarns are in electric contact with the three negative electrode conductive wire materials 13 of the functional yarns 10 each provided with a photovoltaic power generation portion on the upper side of the figure. While, the two second conductive yarns 40F and 40F are not in electrical contact with the three positive electrode conductive wire materials 12 of the functional yarns 10 each provided with a photovoltaic power generation portion on the lower side of the figure (these two second conductive yarns 40F and 40F are arranged on the lower side of the positive electrode conductive wire material 12 with a space therebetween) (see FIG. 3).

On the other hand, the two third conductive yarns 40G and 40G on the right side are in electrical contact with the three positive electrode conductive wire materials 12 of the functional yarns 10 each provided with a photovoltaic power generation portion on the lower side of the drawing. While, the two third conductive yarns 40G and 40G are not in electrical contact with the three negative electrode conductive wire materials 13 of the functional yarns 10 each provided with a photovoltaic power generation portion on the upper side of the drawing (the two third conductive yarns 40G and 40G are arranged on the lower side of the negative electrode conductive wire materials 13 with a space therebetween) (see FIG. 3). Note that although not shown, other warp yarns (insulating yarns) 30 are arranged between the adjacent conductive yarns of the four conductive yarns (four conductive yarns on the right side in FIG. 3) 40F, 40F, 40G, and 40G.

With such a woven structure as described above, the three photovoltaic power generation portions 11 on the upper side of the figure are connected in parallel to form a first group photovoltaic power generation portion. The three photovoltaic power generation portions 11 on the lower side of the figure are connected in parallel to form a second group photovoltaic power generation portion. The first group photovoltaic power generation portion and the second group photovoltaic power generation portion are connected in series via first conductive yarns 40E and 40E. At this time, the upper ends of the two second conductive yarns 40G and 40G on the right side are positive electrode sides. The upper end of the two second conductive yarns 40F and 40F on the left side are negative electrode sides (see FIG. 3).

The woven fabric with a photovoltaic power generation portion according to the third embodiment includes six photovoltaic power generation portions 11 connected in parallel and in series as described above. Therefore, it is possible to generate electricity by light irradiation (solar light irradiation or the like) to the photovoltaic power generation portions 11. Thus, a curtain with a photovoltaic power generation function can be provided by configuring, for example, a curtain with the woven fabric 1 provided with a photovoltaic power generation portion according to the present invention.

In the present invention, the positive electrode conductive wire material 12 is not particularly limited, and for example, a gold wire, a copper wire, a metal-plated fiber, a conductive polymer yarn, or the like may be used. The negative electrode conductive wire material 13 is not particularly limited, and for example, a stainless wire, a copper wire, an aluminum wire, a metal-plated fiber, or a conductive polymer yarn may be used. The photovoltaic power generation portion 11 is not particularly limited, and, for example, a solar battery or the like may be used. The conductive yarn is not particularly limited, and, for example, a metal wire, a metal-plated fiber, a conductive polymer yarn, a metallic covering yarn, or the like may be used. Further, the weft yarn (insulating yarn) 20 is not particularly limited, and examples thereof include a polyethylene terephthalate yarn (PET yarn), a nylon yarn, a polypropylene yarn, an acrylic yarn, a rayon yarn, a hemp yarn, a cotton yarn, a wool yarn, and the like may be used. Further, the warp yarn (insulating yarn) 30 is not particularly limited, and examples thereof include a polyethylene terephthalate yarn (PET yarn), a nylon yarn, a polypropylene yarn, an acrylic yarn, a rayon yarn, a hemp yarn, a cotton yarn, a wool yarn, and the like may be used.

Note that in the first to third embodiments, the positive electrode conductive wire material 12 and the negative electrode conductive wire material 13 which are derived to the left and right from the photovoltaic power generation portion 11 are not woven until the fourth warp yarn (insulating yarn) 30 from the photovoltaic power generation portion 11 (floating state). However, they are not particularly limited to such a structure. For example, they may be plainly woven or the like.

Further, in the first to third embodiments, the warp yarn (insulating yarn) 30 is arranged so as to cover the upper side with respect to the photovoltaic power generation portion 11, but not particularly limited to such a structure. For example, the warp yarn (insulating yarn) 30 may be plainly woven or the like. Alternatively, the warp yarn (insulating yarn) 30 may be arranged on the lower side to sufficiently expose the light-receiving surface of the upper side of the photovoltaic power generation portion 11.

Note that in FIG. 1 to FIG. 3, for ease of explanation and comprehension, the yarns (the warp yarn and the weft yarn) are shown to have a gap therebetween, but the yarns are actually in contact with each other.

INDUSTRIAL APPLICABILITY

The woven fabric with a photovoltaic power generation portion according to the present invention is used, for example, in interior articles, such as, e.g., a curtain, a clothing article, miscellaneous goods, and the like, but not particularly limited to these exemplary applications.

DESCRIPTION OF SYMBOLS

1: Woven fabric with a photovoltaic power generation portion
10: Functional yarn with a photovoltaic power generation portion (weft yarn, etc.)
11: Photovoltaic unit
12: Positive electrode conductive wire material
13: Negative electrode conductive wire material
20: Weft yarn (insulating yarn)
30: Warp yarn (insulating yarn)
40: Conductive yarn (warp yarn, etc.)
51: Disconnection position of a conductive yarn

The invention claimed is:

1. A woven fabric with a photovoltaic power generation portion, comprising:
    a plurality of warp yarns; and
    a plurality of weft yarns,
    wherein at least one weft yarn of the plurality of weft yarns is configured by a functional yarn with a photovoltaic power generation portion,
    wherein the functional yarn includes the photovoltaic power generation portion, a positive electrode conductive wire material connected to a positive electrode of the photovoltaic power generation portion, and a negative electrode conductive wire material connected to a negative electrode of the photovoltaic power generation portion,
    wherein at least two warp yarns of the plurality of warp yarns are conductive yarns, one of the conductive yarns is in electric contact with the positive electrode conductive wire material, and the other of the conductive yarns is in electric contact with the negative electrode conductive wire material, and
    wherein one of the conductive yarns is electrically disconnected in an area corresponding to an area between the positive electrode conductive wire material and the negative electrode conductive wire material.

2. The woven fabric with the photovoltaic power generation portion as recited in claim 1,
    wherein a first set of two conductive yarns of the at least two warp yarns are in electric contact with the positive electrode conductive wire material and arranged in parallel to each other, and
    wherein a second set of two conductive yarns of the at least two warp yarns are in electric contact with the negative electrode conductive wire material and arranged in parallel to each other.

3. The woven fabric with the photovoltaic power generation portion as recited in claim 1,
    wherein a first set of two conductive yarns of the at least two warp yarns in electric contact with the positive electrode conductive wire material are arranged side by side in parallel to each other, and
    wherein a second set of two conductive yarns of the at least two warp yarns in electric contact with the negative electrode conductive wire material are arranged side by side in parallel to each other.

4. A woven fabric with a photovoltaic power generation portion, comprising:
    a plurality of warp yarns; and
    a plurality of weft yarns,
    wherein at least two weft yarns of the plurality of weft yarns are functional yarns comprising a first functional yarn and a second function yarn,
    wherein each of the first and second functional yarns includes a photovoltaic power generation portion, a positive electrode conductive wire material connected to a positive electrode of the photovoltaic power generation portion, and a negative electrode conductive wire material connected to a negative electrode of the photovoltaic power generation portion,
    wherein the first functional yarn and the second functional yarn are arranged away from each other in a warp direction, and the first and second functional yarns are arranged such that the positive electrode conductive wire material of one of the first and second functional yarns and the negative electrode conductive wire material of the other of the first and second functional yarns are arranged on a same side in a weft direction with respect to the photovoltaic power generation portion, wherein a first conductive yarn configured as a warp yarn of the plurality of warp yarns is arranged, the first conductive yarn being in electric contact with the positive electrode conductive wire material of the first functional yarn and in electric contact with the negative electrode conductive wire material of the second functional yarn, wherein a second conductive yarn configured as another warp yarn of the plurality of warp yarns is arranged, the second conductive yarn being in electric contact with the negative electrode conductive wire material of the first functional yarn and in electric contact with the positive electrode conductive wire material of the second functional yarn, and wherein one of the first conductive yarn and the second conductive yarn is electrically disconnected in an area corresponding to between the first functional yarn and the second functional yarn, and the photovoltaic power generation portion of the first functional yarn and the photovoltaic power generation portion of the second functional yarn are connected in series.

* * * * *